United States Patent
Reshotko et al.

(10) Patent No.: US 11,610,810 B2
(45) Date of Patent: Mar. 21, 2023

(54) MASKLESS AIR GAP ENABLED BY A SINGLE DAMASCENE PROCESS

(71) Applicant: Intel Corporation, Santa Clara, CA (US)

(72) Inventors: Miriam R. Reshotko, Portland, OR (US); Richard E. Schenker, Portland, OR (US); Nafees Kabir, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 932 days.

(21) Appl. No.: 16/230,250

(22) Filed: Dec. 21, 2018

(65) Prior Publication Data

US 2020/0203212 A1    Jun. 25, 2020

(51) Int. Cl.
*H01L 21/768* (2006.01)

(52) U.S. Cl.
CPC .... *H01L 21/7682* (2013.01); *H01L 21/76802* (2013.01); *H01L 21/76823* (2013.01); *H01L 21/76837* (2013.01)

(58) Field of Classification Search
CPC ........... H01L 21/7682; H01L 21/76802; H01L 21/76823; H01L 21/76837; H01L 23/5222; H01L 23/5226; H01L 23/53295; H01L 21/76834; H01L 21/76885
USPC .......................................................... 430/311
See application file for complete search history.

(56) References Cited

U.S. PATENT DOCUMENTS

2018/0204760 A1*  7/2018  Chandhok ........... H01L 23/5222
2019/0214342 A1*  7/2019  Lin ..................... H01L 21/7682

* cited by examiner

*Primary Examiner* — Caleen O Sullivan
(74) *Attorney, Agent, or Firm* — Schwabe, Williamson & Wyatt, P.C.

(57) ABSTRACT

A method for fabricating an integrated circuit comprises forming one or more conductive features supported by pillars of a first insulating layer in a first metal layer. One or more vias are formed in a via layer, the one or more vias over and on the first metal layer and in electrical connection with ones of the one or more conductive features. Subsequent to via formation, air gaps are between adjacent ones of the one or more conductive features in the first metal layer to separate the one or more conductive features. A second insulating layer is formed over the one or more conductive features and over the one or more vias, such that the second insulating layer covers the first metal layer and the via layer while bridging over the air gaps, wherein tops the air gaps are substantially coplanar with tops of the one or more conductive features.

9 Claims, 8 Drawing Sheets

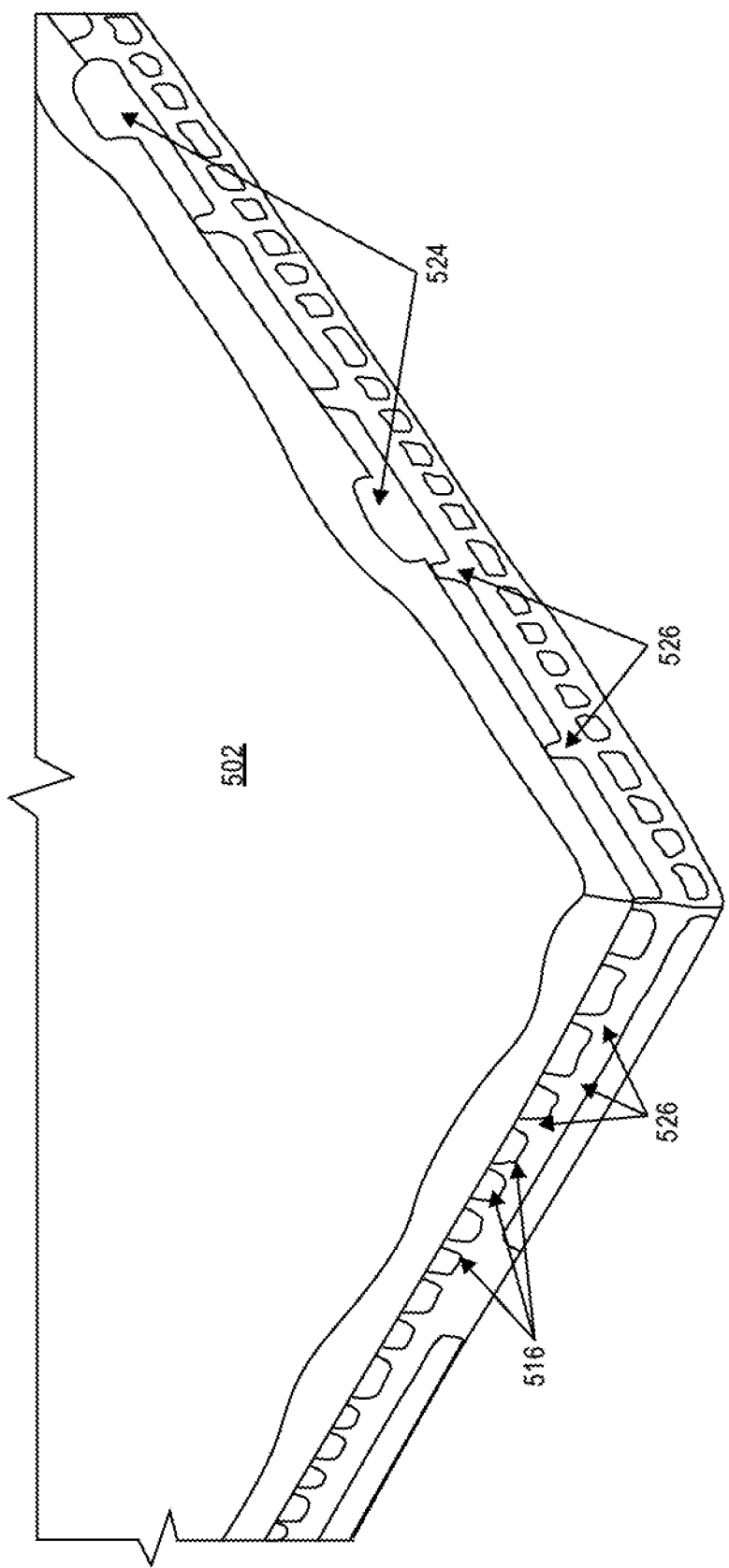

MASKLESS AIR GAP ENABLED BY A SINGLE DAMASCENE PROCESS

TECHNICAL FIELD

Embodiments of the disclosure are in the field of integrated circuit structures and, in particular, a maskless air gap enabled by a single damascene process.

BACKGROUND

Typically, an interconnect structure incorporated into the IC includes one or more levels of metal lines to connect the electronic devices of the IC to one another and to external connections. An interlayer dielectric is placed between the metal levels of the IC for insulation. Generally, the efficiency of the interconnect structure depends on the resistance of each metal line and the coupling capacitance generated between the metal lines. Typically, to reduce the resistance and increase the IC performance, copper interconnect structures are used.

As the size of the IC decreases, the spacing between the metal lines decreases. This leads to increase in the coupling capacitance between the metal lines. Increase in the coupling capacitance between the metal lines has a negative impact on signal transmission along metal lines. Furthermore, increase in the coupling capacitance increases energy consumption of the integrated circuit. One conventional technique to reduce the capacitive coupling between adjacent metal lines involves replacing a high k dielectric material that separates the metal lines with a low k dielectric material.

Another conventional technique to reduce the capacitive coupling involves forming an air gap between adjacent metal lines. Conventional techniques, however, do not typically prevent the unlanded via from punching through the air gap that causes shorts. Typically in the conventional techniques, a hard mask is deposited that blocks the air gap etch in the underlying interconnect layer above which the next interconnect layer via lands.

As the backend interconnect pitch becomes smaller, the regions that need to be masked to prevent etching of the air gap become closer. Generally, the conventional techniques that involve masking off vias locally do not scale with pitch. Typically, the mask layer patterning requires multiple lithography passes and complicated optical proximity correction (OPC) that significantly increases manufacturing cost and reduces yield.

BRIEF DESCRIPTION OF THE DRAWINGS

FIG. 3 is an angled image view of a corner portion of an integrated circuit in a further embodiment in which an optional cap layer is formed over the insulating layer.

DESCRIPTION OF THE EMBODIMENTS

Figure 1A:
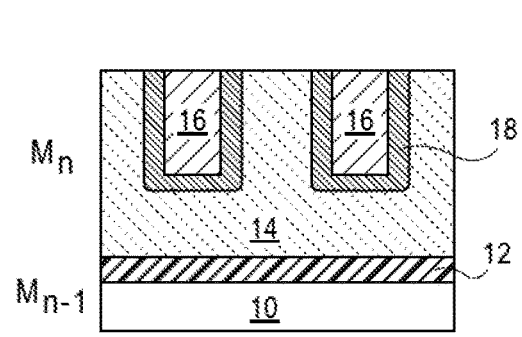
FIGS. 1A-1F illustrate the patterning of a state of the art air gap (AG) in a metal layer $M_n$ of an integrated circuit.

Maskless air gaps enabled by a single damascene process are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to structures and architectures for fabricating a maskless air gap using a single damascene process. Embodiments described herein provide a patterning process that does not need a masked air gap as in a dual damascene process. According to the example embodiments, a next via layer over a metal layer is patterned and metallized prior to performing an air gap etch to the metal layer, eliminating the need to mask the vias. This solution reduces cost by removing one of the lithography masks and operations from the flow. There is potential for greater capacitance benefit since sections of the design do not need to be masked off, therefore all parts of all structures can benefit from the air gap process. One or more embodiments may be implemented to realize any high performance integrated circuit that require reduced capacitance, such as a system on a chip (SoC) of future technology nodes.

To provide context, FIGS. 1A-1F illustrate the patterning of a state of the art air gap (AG) in a metal layer $M_n$ of an integrated circuit. FIGS. 1A-1F illustrate that state of the art air gaps are typically formed using a dual damascene process. The dual-damascene process is characterized by patterning vias and trenches for conductive features, in such a way that metal deposition fills both at the same time.

FIG. 1A shows the process after an insulating layer 14 in metal layer $M_n$ is deposited over a conductive feature 10 and etch stop layer 12 in metal layer $M_{n-1}$, and after conductive features 16 are formed in the insulating layer 14. In one embodiment, the conductive features 10 and 16 are formed using one of conductive feature forming techniques known to one of ordinary skill in the art of microelectronic device manufacturing. In one embodiment, the insulating layer 14 is patterned to form openings (e.g., trenches). In one embodiment, the openings in insulating layer 14 are formed using well-known patterning and etching techniques. A conductive material layer, e.g., a conductive material on a base layer 18, is deposited to fill the openings in the insulating layer 14. One of chemical-mechanical polishing (CMP) techniques is used to remove the portions of the conductive material layer that extend above the top of the insulating layer to form patterned conductive features, such as conductive features 16. In the case where the conductive features 10 and 16 comprise Cu, the base layer 18 may comprise a diffusion barrier and seed layer. The diffusion barrier, which may be a Ta-based layer, avoids that Cu atoms migrate into the insulating layer 14, and provides good adhesion to Cu.

Figure 1B:
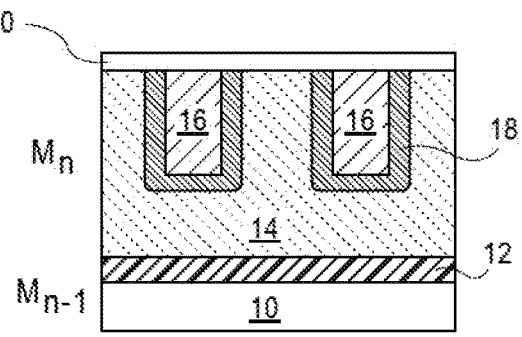

FIG. 1B illustrates the process after a photoresist or hard mask 20 is formed over a top surface of the insulating layer 14 and the conductive features 16 with openings defining locations for air gaps between adjacent conductive features.

Figure 1C:
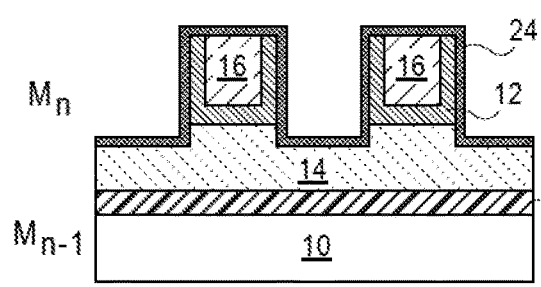

FIG. 1C illustrates the process after the insulating layer 14 is etched under openings in the mask 20, and the mask 20 is removed to form air gaps in the insulating layer 14 in metal layer $M_n$ before next metal layer $M_{n+1}$ processing. An etch stop layer 24 is shown conformally deposited over the insulating layer 14 and along outer walls and the top surface of conductive features 16.

Figure 1D:
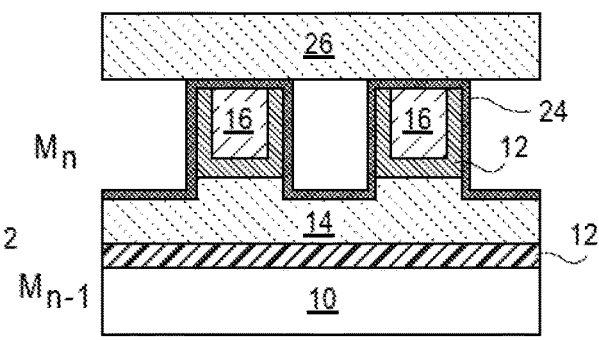

FIG. 1D illustrates the process after an insulating layer 26 is formed in metal layer $M_{n+1}$ over air gaps and conductive features 16 in metal layer $M_n$.

Figure 1E:
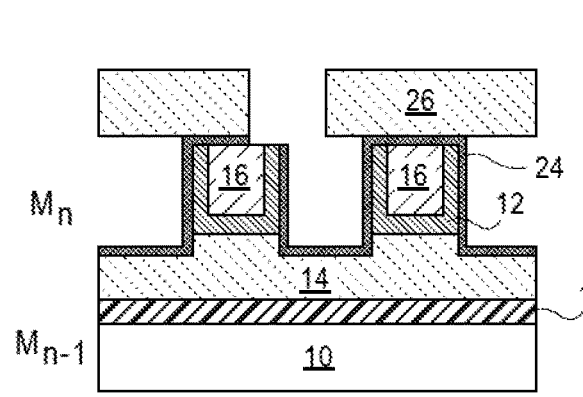
Figure 1F:
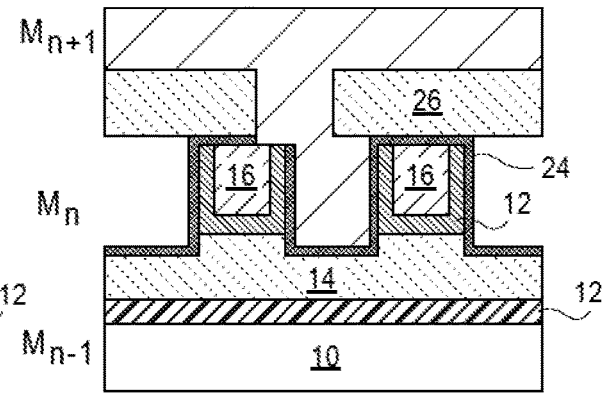

FIG. 1E illustrates the process after the insulating layer 26 in metal layer $M_{n+1}$ is patterned to form one or more via openings using well-known patterning and etching techniques, which occurs after the air gap etch. FIG. 1F shows the via opening filled with a conductive material layer. However, because the via is formed after the air gaps, and the patterning of via results in the via being unlanded or misaligned with the conductive feature 16 (left), the via lands on the air gap, which in turn enables the conductive material layer to enter the air gap between conductive features 16 and cause a short. In order to prevent the formation of misaligned vias, a mask is required to form a keep-away zone for the via etch near the air gaps.

According to the disclosed embodiments, one or more maskless air gaps are fabricated by single damascene process in which vias in an upper metal layer are patterned and metallized before the air gap etch is performed in the lower metal layer. The disclosed embodiments, thus removes any issue with unlanded/misaligned vias since the air gap etch takes place after the vias are already formed. Such a solution reduces cost by removing one of the lithography masks and operations from the fabrication process flow. There is potential for greater capacitance benefit since no sections of the design will need to be masked off, and therefore all parts of all structures can benefit from the air gap process.

Figure 2A:
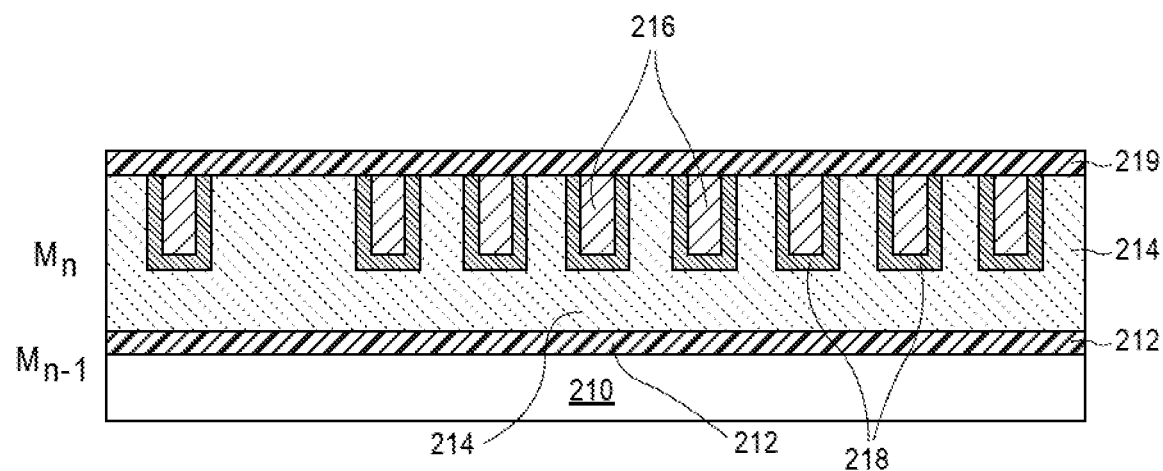
FIGS. 2A-2F illustrates a process for fabricating a maskless air gap by single damascene process according to the disclosed embodiments

FIGS. 2A-2F illustrates a process for fabricating a maskless air gap by single damascene process according to the disclosed embodiments. FIG. 2A shows that the process may begin similar to the process of FIG. 1A in which an insulating layer 214 in metal layer $M_n$ is deposited over an etch stop layer 212 on a conductive feature 210 in metal layer $M_{n-1}$, and conductive features 216 are formed in the insulating layer 214. In one embodiment, the conductive features 210 and 216 are formed using one of conductive feature forming techniques known to one of ordinary skill in the art of microelectronic device manufacturing. In one embodiment, the insulating layer 214 is patterned to form openings (e.g., trenches). In one embodiment, the openings in insulating layer 214 are formed using well-known patterning and etching techniques. A conductive material layer, e.g., a conductive material on a base layer 218, is deposited to fill the openings in the insulating layer 214. One of chemical-mechanical polishing (CMP) techniques is used to remove the portions of the conductive material layer that extend above the top of the insulating layer to form patterned conductive features, such as conductive features 216. An etch stop layer 219 is then formed over top surfaces of the insulating layer 214 and the conductive features 216.

In one embodiment, the base layer 218 may include a conductive seed layer deposited on a conductive barrier layer. In one embodiment, the seed layer includes copper (Cu). In another embodiment, the seed layer includes tungsten (W). In alternative embodiments, the seed layer is copper, titanium nitride, ruthenium, nickel, cobalt, tungsten, or any combination thereof. In more specific embodiment, the seed layer is copper. In one embodiment, the conductive barrier layer includes aluminum, titanium, titanium nitride, tantalum, tantalum nitride, tungsten, cobalt, ruthenium, the like metals, or any combination thereof. Generally, the conductive barrier layer is used to prevent diffusion of the conductive material from the seed layer into insulating layer 214 and to provide adhesion for the seed layer. In one embodiment, the base layer comprises the seed layer on the barrier layer that is deposited on the sidewalls and bottom of the openings in the insulating layer 214. In another embodiment, the base layer includes the seed layer that is directly deposited on the sidewalls and bottom of the openings in the insulating layer 214. Each of the conductive barrier layer and seed layer may be deposited using any thin film deposition technique known to one of ordinary skill in the art of semiconductor manufacturing, e.g., by sputtering, blanket deposition, and the like. In one embodiment, each of the conductive barrier layer and the seed layer has the thickness in the approximate range of 1 nanometers (nm) to 100 nm. In one embodiment, the barrier layer may be a thin dielectric that has been etched to establish conductivity to the metal layer below. In one embodiment, the barrier layer may be omitted altogether and appropriate doping of the copper line may be used to make a "self-forming barrier".

In one embodiment, an electroplating process deposits a conductive layer of copper onto the seed layer to form the conductive features 210 and 216. In another embodiment, the conductive layer is deposited onto the seed layer using one of selective deposition techniques known to one of ordinary skill in the art of semiconductor manufacturing, e.g., electroplating, electroless plating, or the like techniques. In one embodiment, the choice of a material for the conductive layer determines the choice of a material for the seed layer. For example, if the material for conductive layer includes copper, the material for the seed layer also includes copper. In one embodiment, conductive layer includes e.g., copper (Cu), ruthenium (Ru), nickel (Ni), cobalt (Co), chromium (Cr), iron (Fe), manganese ($M_n$), titanium (Ti), aluminum (Al), hafnium (Hf), tantalum (Ta), tungsten (W), Vanadium (V), Molybdenum (Mo), palladium (Pd), gold (Au), silver (Au), platinum Pt, or any combination thereof.

In alternative embodiments, examples of the conductive materials that may be used for the conductive layer to form conductive features 210 and 216 include, but are not limited to, metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

In one embodiment, the width of the conductive features 210 and 216 is less than about 40 nm. In one embodiment, the width of the conductive feature 216, which are shown with a fin length in the z-direction, is in an approximate range of 5 nm ("μm") to about 40 nm. In one embodiment, the height of the conductive features is less than about 65 nm. In one embodiment, the height of the conductive features is in the approximate range of 8 nm to 65 nm. In one embodiment, the distance (pitch) between the conductive features 216 is less than about 50 nm. In one embodiment, the pitch is from about 10 nanometers (nm) to about 45 nm.

In one embodiment, insulating layer 214 is an interlayer dielectric (ILD) layer. In one embodiment, insulating layer 214 is an oxide layer, e.g., a silicon oxide layer. In one embodiment, insulating layer 214 is a low-k dielectric, e.g., silicon dioxide, silicon oxide, carbon doped oxide ("CDO"), or any combination thereof. In one embodiment, insulating layer 214 includes a nitride, oxide, a polymer, phosphosilicate glass, fluorosilicate ("SiOF") glass, organosilicate glass ("SiOCH"), or any combination thereof. In another embodiment, insulating layer 214 is a nitride layer, e.g., silicon nitride layer. In alternative embodiments, insulating layer 214 is an aluminum oxide, silicon oxide nitride, other oxide/nitride layer, any combination thereof, or other electrically insulating layer determined by an electronic device design.

In one embodiment, the thickness of the insulating layer 214 is determined by design. In one embodiment, the insulating layer 214 is deposited to the thickness from about 50 nanometers (nm) to about 2 microns (μm). In an embodiment, insulating layer 214 is deposited using one of deposition techniques, such as but not limited to a chemical vapor deposition ("CVD"), e.g., a plasma enhanced chemical vapor deposition ("PECVD"), a physical vapor deposition ("PVD"), molecular beam epitaxy ("MBE"), metalorganic chemical vapor deposition ("MOCVD"), atomic layer deposition ("ALD"), spin-on, or other deposition techniques known to one of ordinary skill in the art of microelectronic device manufacturing.

In one embodiment, etch stop layers 212 and 219 may comprise an oxide layer, e.g., a silicon oxide layer, a carbon doped oxide layer, e.g., a carbon doped silicon oxide layer, a silicon oxy carbide (SiOC) layer, a fluorine-doped silicon oxide, a metal oxide, e.g., a titanium oxide, an aluminum oxide, a hafnium oxide, or any other metal oxide; a hydrogensilesquioxane (HSQ), a fluorinated amorphous carbon, a methylsesquioxane (MSQ), a nitride layer, e.g., a silicon nitride, a titanium nitride, a silicon oxide nitride, silicon carbide, or other etch stop layer. In alternate embodiments, etch stop layers 212 and 219 may comprise a Tillable nitride based material, e.g., a flowable nitride. In one embodiment, etch stop layers 212 and 219 may comprise a silicon nitride, silicon carbide, or any combination thereof.

In one embodiment, the thickness of the etch stop layers 212 and 219 is from about 2 nm to about 20 nm. In more specific embodiments, the thickness of the etch stop layers 212 and 219 is from about 5 nm to about 15 nm. In one embodiment, etch stop layers 212 and 219 may be deposited using one of deposition techniques, such as but not limited to a spin-on, a chemical vapor deposition ("CVD"), e.g., a plasma enhanced chemical vapor deposition ("PECVD"), a physical vapor deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing.

In one embodiment, conductive features 210 in metal layer $M_{n-1}$ and lower are also formed in insulating layers. For example, metal layer $M_n$ may represent metal layer M4. However, in one embodiment, metal layer $M_n$ may be the lowest metal layer. In any case, the lowest metal layer of an integrated circuit may be formed over a substrate (not shown).

In an embodiment, the substrate comprises a semiconductor material, e.g., silicon (Si). In one embodiment, substrate is a monocrystalline Si substrate. In another embodiment, substrate is a polycrystalline silicon substrate. In another embodiment, substrate represents a previous interconnect layer. In yet another embodiment, substrate is an amorphous silicon substrate. In alternative embodiments, substrate includes silicon, germanium ("Ge"), silicon germanium ("SiGe"), a III-V materials based material e.g., gallium arsenide ("GaAs"), or any combination thereof. In one embodiment, the substrate includes metallization interconnect layers for integrated circuits. In at least some embodiments, the substrate includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In at least some embodiments, the substrate includes interconnects, for example, vias, configured to connect the metallization layers.

In an embodiment, substrate is a semiconductor-on-isolator (SOI) substrate including a bulk lower substrate, a middle insulation layer, and a top monocrystalline layer. The top monocrystalline layer may comprise any material listed above, e.g., silicon.

In various implementations, the substrate can be, e.g., an organic, a ceramic, a glass, or a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present invention.

Figure 2B:
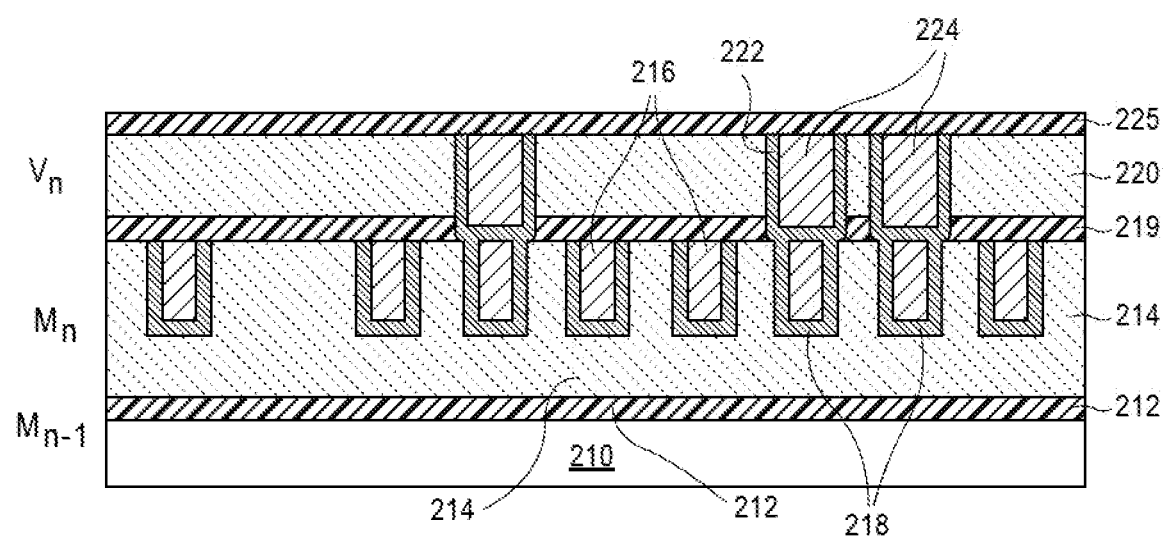

Referring now to FIG. 2B, a departure from state of the art via forming techniques is shown according to the disclosed embodiments in which one or more vias in an insulating layer 220 in adjacent upper via layer (e.g., $V_n$) are formed using a single damascene process prior to air gap formation in metal layer $M_n$. For example, if metal layer $M_n$ represents metal layer M4, for instance, then vias are form in metal or via layer V4 over and in electrical connection with ones of the one or more conductive features 216, as shown. In an embodiment, a single via layer $V_n$ is formed, i.e., a via layer without a corresponding metal layer. That is, the single via layer $V_n$ is formed in a half layer of insulating layer 220 over the metal layer $M_n$ in which air gaps will subsequently be formed. As shown, each via 224 is formed through etch stop layer 219 on one of the conductive features 216.

In one embodiment, the process of forming one or more vias in the upper via layer further includes forming an insulating layer 220 in via layer $V_n$ and patterning the insulating layer 220 to form openings (e.g., trenches) where vias are to be formed. In one embodiment, the openings in insulating layer 214 are formed using well-known patterning and etching techniques. A conductive material layer, e.g., a conductive material on a base layer 222, is deposited to fill the openings in the insulating layer 220. One of chemical-mechanical polishing (CMP) techniques is used to remove the portions of the conductive material layer that extend above the top of the insulating layer 220 to form patterned conductive features, such as vias 224. An etch stop layer 225 is then formed over top surfaces of the insulating layer 220 and the vias 224.

Figure 2C:
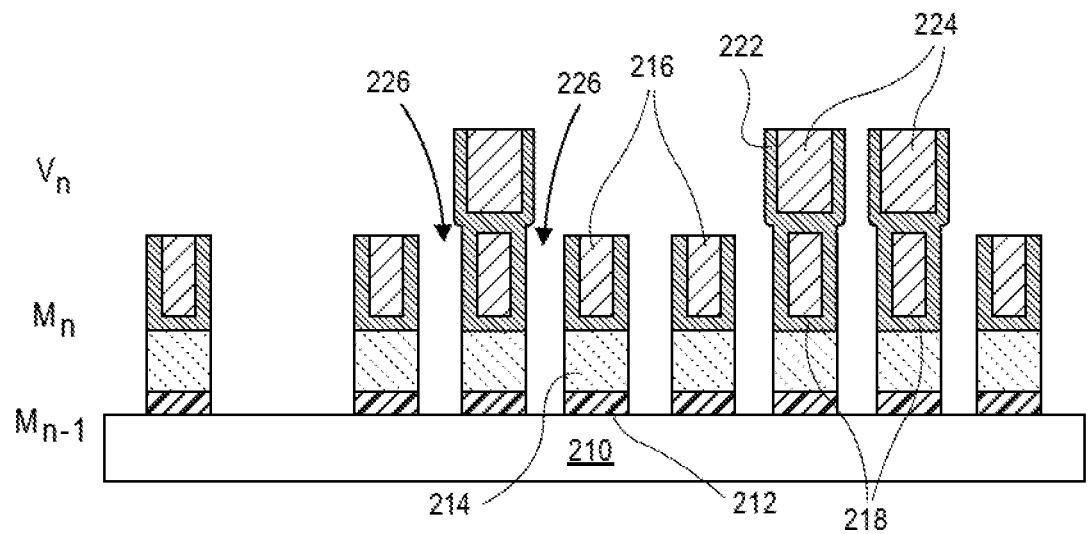

FIG. 2C illustrates that after the vias 224 are formed in via layer $V_n$, a maskless air gap etch is performed on the insulating layer 220 in via layer $V_n$ and the insulating layer 214 in metal layer $M_n$ to form air gaps 226 between adjacent ones of the conductive features 216 in metal layer $M_n$. In one embodiment, the maskless air gap etch selectively removes etch stop layer 225 and insulating layer 220 from via layer $V_n$; selectively removes etch stop layer 212 and insulating layer 214 in metal layer $M_n$ except for portions of the insulating layer 214 directly beneath conductive features 216; and optionally selectively removes etch stop layer 212 from metal layer $M_{n-1}$ except for portions beneath conductive features 216 and pillars of insulating layer 214. What remains after the maskless air gap etch are the conductive features 216 supported by pillars of insulating layer 214 and vias 224 over certain ones of the conductive features 216. The air gap etch is anisotropic so it does not etch insulating layer 214 and etch stop layer 212 directly beneath the conductive features 216. In another embodiment, the etch could stop level with the bottom of the conductive features 216.

Figure 2D:
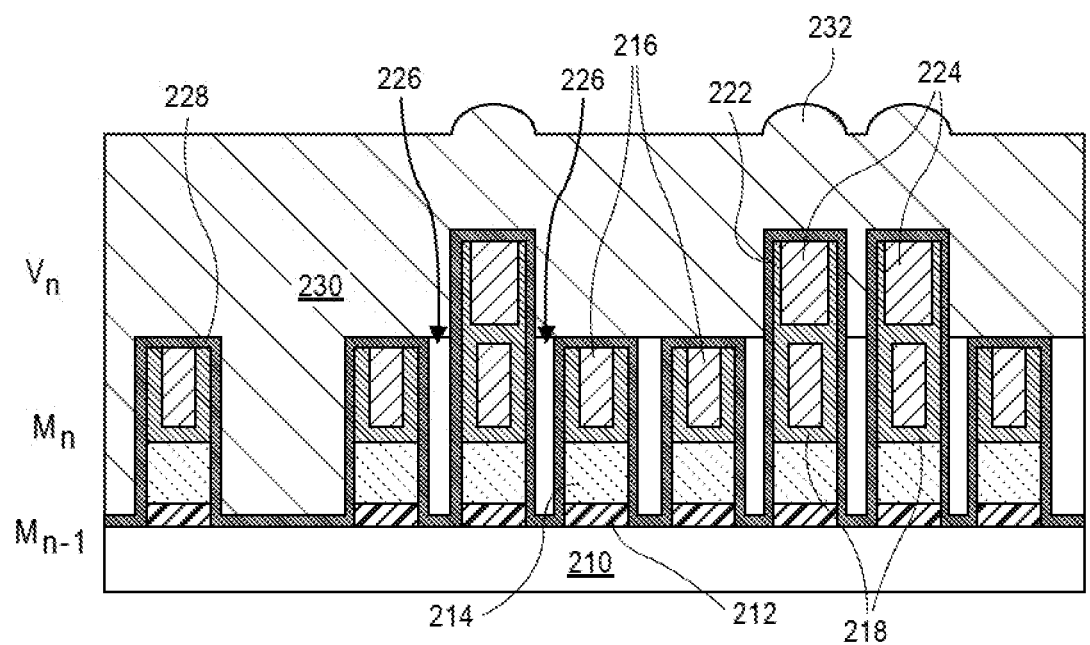

FIG. 2D illustrates that after the air gap etch, a wraparound etch stop layer 228 is shown conformally deposited over the conductive feature 210 in metal layer $M_{n-1}$ if present or over a substrate otherwise, and along the top surface of conductive features 216 and vias 224, and along sidewalls of the conductive features 216 and the insulating layer 214 and etch stop layer 212 beneath the respective conductive features 216. In one embodiment, the wraparound etch stop layer 228 is formed thicker than etch stop layers 212 and 219 because the wraparound etch stop layer 228 must be formed around the vias 224 and conductive features 216.

FIG. 2D also illustrates that after the wraparound etch stop layer 228 is formed, another insulating layer 230 is formed over the wraparound etch stop layer 228 (and thus the conductive features 216 and vias 224 in the metal layer $M_n$ and via layer $V_n$, respectively) to bridge over the air gaps 226. Due to the maskless air gap etch, an integrated circuit structure is fabricated with a plurality of vias 224 in a via layer over and on a plurality of corresponding conductive features 216 in the lower metal layer $M_n$. Air gaps 226 are between adjacent ones the conductive features 216 in metal layer $M_n$ to separate the conductive features 216. More specifically, the air gaps 226 are located directly adjacent to each side of ones of the plurality of vias 224 in the metal layer $M_n$. Insulating layer 230 is over conductive features 216 and the vias 224, such that the insulating layer 230 covers both metal layer $M_n$ and via layer $V_n$ while bridging over the air gaps 226.

In one embodiment, tops of the air gaps are substantially coplanar with tops of the one or more conductive features 216. In one embodiment, the air gaps have a height substantially equal to a height of the conductive features, the pillars of insulating layer 214 and etch stop layer 212. In one embodiment, the air gaps have a height substantially equal to a height of the conductive features only. In one embodiment, the distance (pitch) between the air gaps 226 is less than approximately 50 nm. In one embodiment, the pitch between the air gaps 226 is approximately 10 to 45 nm.

In one embodiment, insulating layer 230 is an interlayer dielectric (ILD) layer. In one embodiment, insulating layer 230 is an oxide layer, e.g., a silicon oxide layer. In one embodiment, insulating layer 230 is a low-k dielectric, e.g., silicon dioxide, silicon oxide, carbon doped oxide ("CDO"), or any combination thereof. In one embodiment, insulating layer 102 includes a nitride, oxide, a polymer, phosphosilicate glass, fluorosilicate ("SiOF") glass, organosilicate glass ("SiOCH"), or any combination thereof. In another embodiment, insulating layer 230 is a nitride layer, e.g., silicon nitride layer. In alternative embodiments, insulating layer 230 is an aluminum oxide, silicon oxide nitride, other oxide/nitride layer, any combination thereof, or other electrically insulating layer determined by an electronic device design.

In one embodiment, the insulating layer 230 is deposited with a thickness sufficient to cover 1½ metal layers, i.e., metal layer $M_n$ and via layer $V_n$, which is a half layer. In an embodiment, insulating layer 230 is deposited using one of deposition techniques, such as but not limited to a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), spin-on, or other deposition techniques known to one of ordinary skill in the art of microelectronic device manufacturing. In one embodiment, deposition of the insulating layer 230 may result in formation of protrusions 232 in the insulating layer 230 over underlying via locations.

Figure 2E:
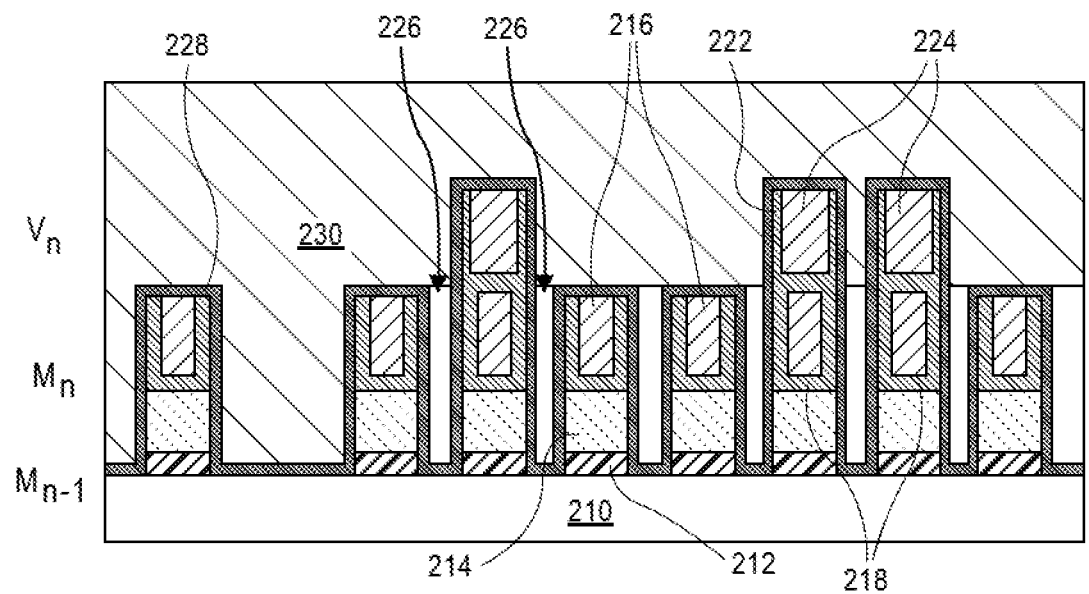

FIG. 2E illustrates that after the insulating layer 230 is deposited, any protrusions 232 in the insulating layer 230 over underlying via locations are etched back to provide a planar insulating layer 230 in preparation for next layer fabrication.

FIG. 3 is an angled image view 502 of a corner portion of an integrated circuit in a further embodiment. The left side of the view 502 corresponds to the cross-section views shown in FIGS. 2A-2F. The right side of the view corresponds to a cross-section in a fin direction of the conductive features 516. Air gaps 526 are visible between conductive features 516. Also shown are upper layer vias 524 over some of the conductive features 516.

Figure 2F:
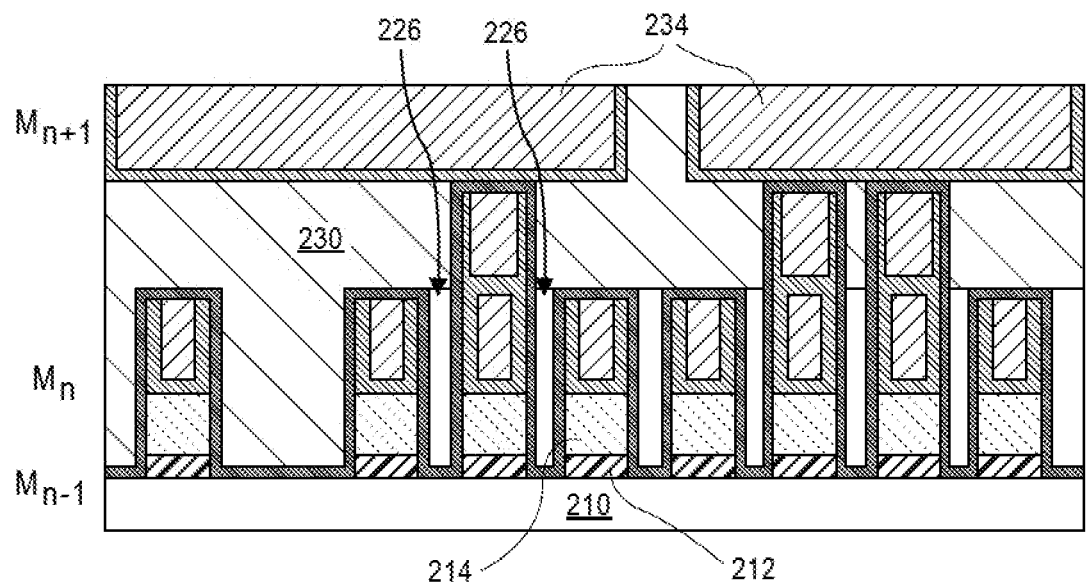

Referring now to FIG. 2F, after insulating layer 230 is planarized to remove any protrusions, FIG. 2F illustrates that one or more conductive features 234 are patterned in metal layer $M_{n+1}$ over via layer $V_n$, where at least a portion of the vias 224 electrically connect the one or more conductive features 234 with the conductive features 216 in metal layer $M_n$. The process may continue with additional upper layer patterning, including the formation of maskless air gaps.

In summary, an integrated circuit having maskless air gaps may be generally fabricated by forming one or more conductive features supported by pillars of a first insulating layer in a first metal layer. One or more vias are formed in a via layer, the one or more vias are over and on the first metal layer and in electrical connection with ones of the one or more conductive features. Subsequent to via formation, air gaps are between adjacent ones of the one or more conductive features in the first metal layer to separate the one or more conductive features. A second insulating layer is formed over the one or more conductive features and over the one or more vias, such that the second insulating layer covers the first metal layer and the via layer while bridging over the air gaps, wherein tops the air gaps are substantially coplanar with tops of the one or more conductive features.

The integrated circuit structures described herein may be included in an electronic device. As an example of one such apparatus, FIGS. 4A and 4B are top views of a wafer and dies that include one or more maskless air gaps enabled by a single damascene process, in accordance with one or more of the embodiments disclosed herein.

Figure 4B:
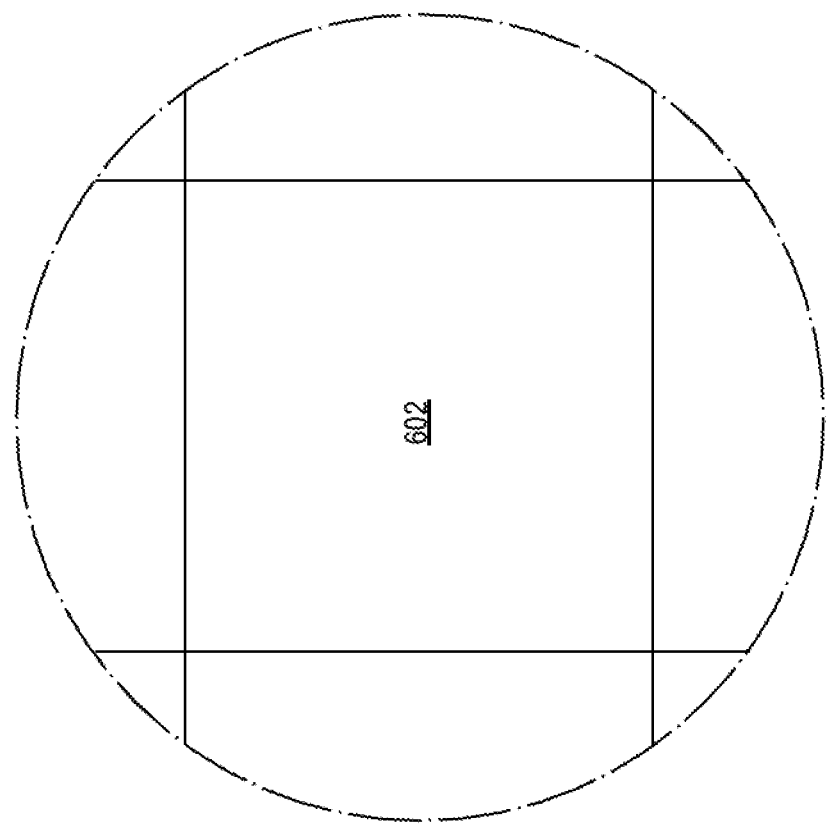
FIGS. 4A and 4B are top views of a wafer and dies that include one or more maskless air gaps enabled by a single damascene process, in accordance with one or more of the embodiments disclosed herein.
Figure 4A:
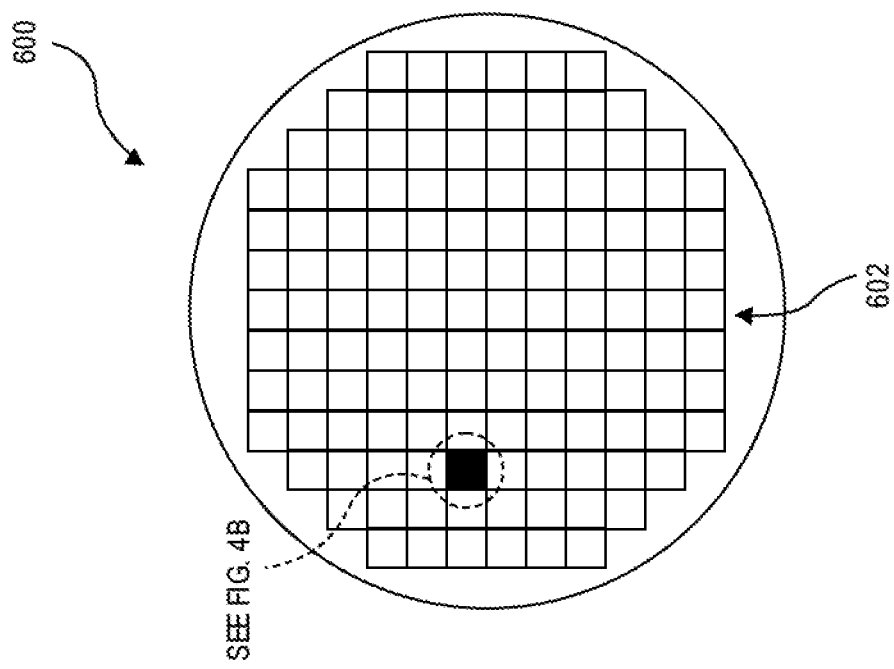

Referring to FIGS. 4A and 4B, a wafer 600 may be composed of semiconductor material and may include one or more dies 602 having integrated circuit (IC) structures formed on a surface of the wafer 600. Each of the dies 602 may be a repeating unit of a semiconductor product that includes any suitable IC (e.g., ICs including one or more maskless air gaps enabled by a single damascene process, such as described above. After the fabrication of the semiconductor product is complete, the wafer 600 may undergo a singulation process in which each of the dies 602 is separated from one another to provide discrete "chips" of the semiconductor product. In particular, structures that include embedded non-volatile memory structures having an independently scaled selector as disclosed herein may take the form of the wafer 600 (e.g., not singulated) or the form of the die 602 (e.g., singulated). The die 602 may include one or more embedded non-volatile memory structures based independently scaled selectors and/or supporting circuitry to route electrical signals, as well as any other IC components. In some embodiments, the wafer 600 or the die 602 may include an additional memory device (e.g., a static random access memory (SRAM) device), a logic device (e.g., an AND, OR, NAND, or NOR gate), or any other suitable circuit element. Multiple ones of these devices may be combined on a single die 602. For example, a memory array formed by multiple memory devices may be formed on a same die 602 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 5:
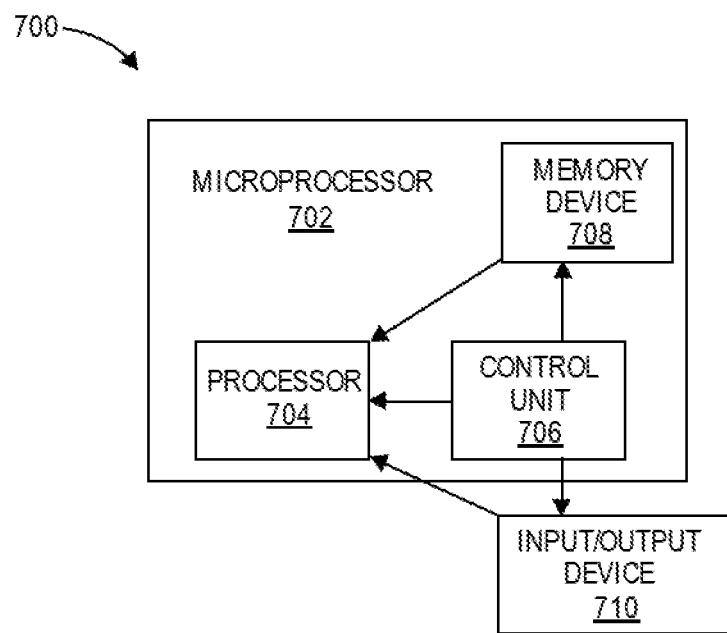
FIG. 5 illustrates a block diagram of an electronic system, in accordance with an embodiment of the present disclosure.
Figure 7:
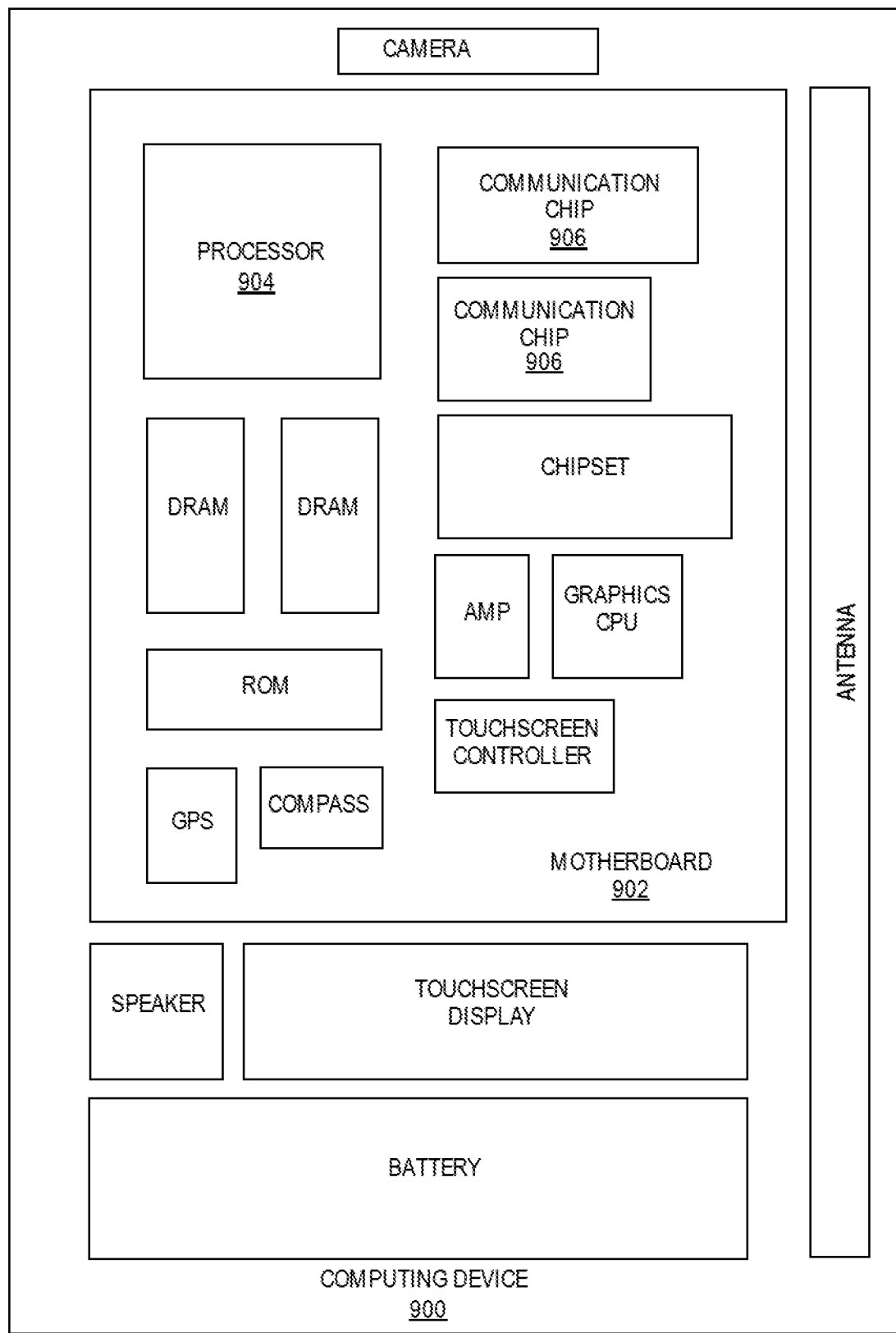
FIG. 7 illustrates a computing device in accordance with one implementation of the disclosure.

FIG. 5 illustrates a block diagram of an electronic system 700, in accordance with an embodiment of the present disclosure. The electronic system 700 can correspond to, for example, a portable system, a computer system, a process control system, or any other system that utilizes a processor and an associated memory. The electronic system 700 may include a microprocessor 702 (having a processor 704 and control unit 706), a memory device 708, and an input/output device 710 (it is to be appreciated that the electronic system 700 may have a plurality of processors, control units, memory device units and/or input/output devices in various embodiments). In one embodiment, the electronic system 700 has a set of instructions that define operations which are to be performed on data by the processor 704, as well as, other transactions between the processor 704, the memory device 708, and the input/output device 710. The control unit 706 coordinates the operations of the processor 704, the memory device 708 and the input/output device 710 by cycling through a set of operations that cause instructions to be retrieved from the memory device 708 and executed. The memory device 708 can include a non-volatile memory cell as described in the present description. In an embodiment, the memory device 708 is embedded in the microprocessor 702, as depicted in FIG. 7. In an embodiment, the processor 704, or another component of electronic system 700, includes one or more maskless air gaps enabled by a single damascene process, such as those described herein.

Figure 6:
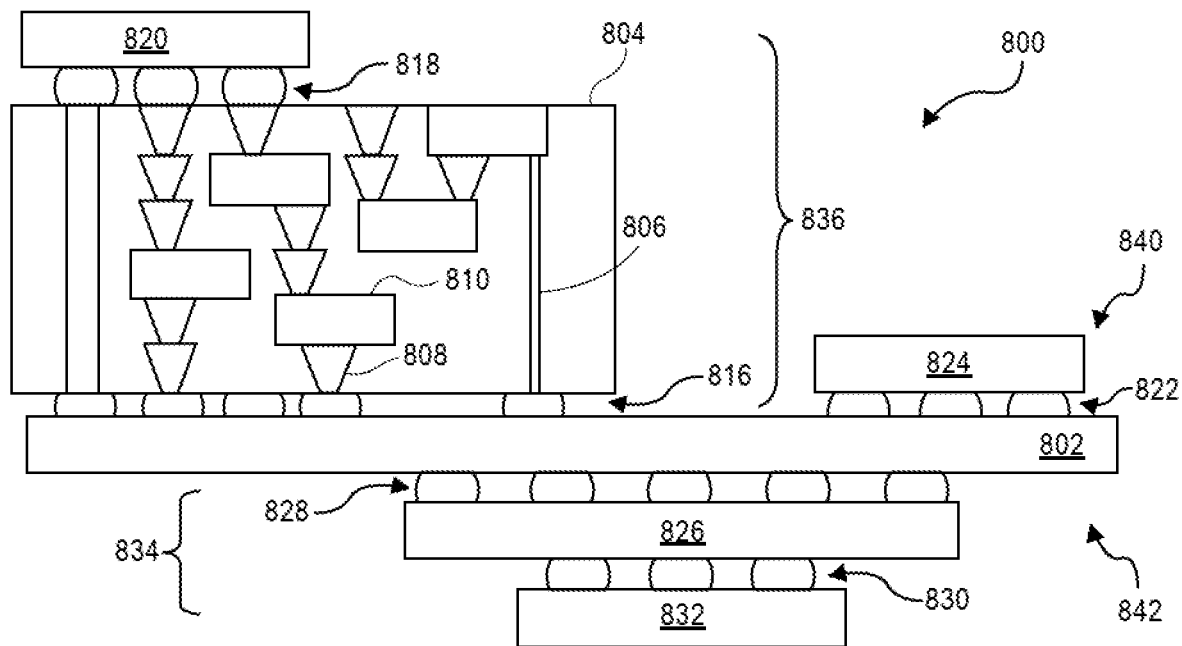
FIG. 6 is a cross-sectional side view of an integrated circuit (IC) device assembly that may include one or more maskless air gaps enabled by a single damascene process, in accordance with one or more of the embodiments disclosed herein.

FIG. 6 is a cross-sectional side view of an integrated circuit (IC) device assembly that may include one or more maskless air gaps enabled by a single damascene process, in accordance with one or more of the embodiments disclosed herein.

Referring to FIG. 6, an IC device assembly 800 includes components having one or more integrated circuit structures described herein. The IC device assembly 800 includes a number of components disposed on a circuit board 802 (which may be, e.g., a motherboard). The IC device assembly 800 includes components disposed on a first face 840 of the circuit board 802 and an opposing second face 842 of the circuit board 802. Generally, components may be disposed on one or both faces 840 and 842. In particular, any suitable ones of the components of the IC device assembly 800 may include a number of maskless air gaps enabled by a single damascene process, such as disclosed herein.

In some embodiments, the circuit board 802 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate.

The IC device assembly 800 illustrated in FIG. 6 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 6), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 816. Although a single IC package 820 is shown in FIG. 6, multiple IC packages may be coupled to the interposer 804.

It is to be appreciated that additional interposers may be coupled to the interposer 804. The interposer 804 may provide an intervening substrate used to bridge the circuit board 802 and the IC package 820. The IC package 820 may be or include, for example, a die (the die 602 of FIG. 4B), or any other suitable component. Generally, the interposer 804 may spread a connection to a wider pitch or reroute a connection to a different connection. For example, the interposer 804 may couple the IC package 820 (e.g., a die) to a ball grid array (BGA) of the coupling components 816 for coupling to the circuit board 802. In the embodiment illustrated in FIG. 6, the IC package 820 and the circuit board 802 are attached to opposing sides of the interposer 804. In other embodiments, the IC package 820 and the circuit board 802 may be attached to a same side of the interposer 804. In some embodiments, three or more components may be interconnected by way of the interposer 804.

The interposer 804 may be formed of an epoxy resin, a fiberglass-reinforced epoxy resin, a ceramic material, or a polymer material such as polyimide. In some implementations, the interposer 804 may be formed of alternate rigid or flexible materials that may include the same materials described above for use in a semiconductor substrate, such as silicon, germanium, and other group III-V and group IV materials. The interposer 804 may include metal interconnects 810 and vias 808, including but not limited to through-silicon vias (TSVs) 806. The interposer 804 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art.

The IC device assembly 800 may include an IC package 824 coupled to the first face 840 of the circuit board 802 by coupling components 822. The coupling components 822 may take the form of any of the embodiments discussed above with reference to the coupling components 816, and the IC package 824 may take the form of any of the embodiments discussed above with reference to the IC package 820.

The IC device assembly 800 illustrated in FIG. 6 includes a package-on-package structure 834 coupled to the second face 842 of the circuit board 802 by coupling components 828. The package-on-package structure 834 may include an IC package 826 and an IC package 832 coupled together by coupling components 830 such that the IC package 826 is disposed between the circuit board 802 and the IC package 832. The coupling components 828 and 830 may take the form of any of the embodiments of the coupling components 816 discussed above, and the IC packages 826 and 832 may take the form of any of the embodiments of the IC package 820 discussed above. The package-on-package structure 834 may be configured in accordance with any of the package-on-package structures known in the art.

FIG. 7 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the disclosure, the integrated circuit die of the processor includes one or more maskless air gaps enabled by a single damascene process, in accordance with implementations of embodiments of the disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the disclosure, the integrated circuit die of the communication chip includes one or more maskless air gaps enabled by a single damascene process, in accordance with implementations of embodiments of the disclosure.

In further implementations, another component housed within the computing device 900 may contain an integrated circuit die that includes one or more maskless air gaps enabled by a single damascene process, in accordance with implementations of embodiments of the disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Thus, embodiments described herein include maskless air gaps enabled by a single damascene process.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure, comprises one or more conductive features supported by pillars of a first insulating layer in a first metal layer. One or more vias is in a via layer, the one or more vias over and on the first metal layer and in electrical connection with ones of the one or more conductive features. Air gaps are between adjacent ones of the one or more conductive features in the first metal layer to separate the one or more conductive features. A second insulating layer is over the one or more conductive features and over the one or more vias, such that the second insulating layer covers the first metal layer and the via layer while bridging over the air gaps, wherein tops the air gaps are substantially coplanar with tops of the one or more conductive features.

Example embodiment 2: The integrated circuit structure of example embodiment 1 wherein the air gaps have a pitch of less than approximately 50 nm.

Example embodiment 3: The integrated circuit structure of example embodiment 2, wherein the air gaps have a pitch of approximately 10 to 45 nm.

Example embodiment 4: The integrated circuit structure of example embodiment 1, wherein the one or more conductive features comprise a conductive material layer on a base layer.

Example embodiment 5: The integrated circuit structure of example embodiment 4, wherein the base layer comprise a conductive seed layer on a conductive barrier layer.

Example embodiment 6: The integrated circuit structure of example embodiment 1, wherein the one or more conductive features in the first metal layer supported by the pillars of the first insulating layer further include a first etch stop layer beneath the pillars of the first insulating layer.

Example embodiment 7: The integrated circuit structure of example embodiment 1, further comprising: a second etch stop layer along a top surface of the one or more conductive features and the vias, and along sidewalls formed by the one or more conductive features and the first insulating layer beneath the one or more conductive features.

Example embodiment 8: The integrated circuit structure of example embodiment 7, wherein the second insulating layer is over the second etch stop layer.

Example embodiment 9: The integrated circuit structure of example embodiment 1, further comprising: one or more additional conductive features in a third metal layer over the via layer, wherein at least a portion of the vias electrically connect the one or more additional conductive features with the one or more conductive features in the first metal layer.

Example embodiment 10: A method for fabricating an integrated circuit comprises forming one or more conductive features supported by pillars of a first insulating layer in a first metal layer. One or more vias are formed in a via layer over and on the first metal layer and in electrical connection with ones of the one or more conductive features. Subsequent to via formation, air gaps are between adjacent ones of the one or more conductive features in the first metal layer to separate the one or more conductive features. A second insulating layer is formed over the one or more conductive features and over the one or more vias, such that the second insulating layer covers the first metal layer and the via layer while bridging over the air gaps, wherein tops the air gaps are substantially coplanar with tops of the one or more conductive features.

Example embodiment 11: The method of example embodiment 10, further comprising: forming the air gaps with a pitch of less than approximately 50 nm.

Example embodiment 12: The method of example embodiment 11, further comprising: forming the air gaps with a pitch of approximately 10 to 45 nm.

Example embodiment 13: A method of fabricating an integrated circuit comprises forming a first insulating layer in a metal layer $M_n$ and forming one or more conductive features in the first insulating layer. One or more vias is in a second insulating layer in an adjacent upper metal layer $M_{n+1}$ in electrical connection with ones of the one or more conductive features. After forming the one or more vias, a maskless air gap etch is performed on both the second insulating layer and the first insulating layer to form air gaps between adjacent ones of the one or more conductive features in the metal layer $M_n$.

Example embodiment 14: The method of example embodiment 13, further comprising: performing the maskless air gap etch such that the air gaps have a pitch of less than approximately 50 nm.

Example embodiment 15: The method of example embodiment 14, further comprising: performing the maskless air gap etch such that the air gaps have a pitch of approximately 10 to 45 nm.

Example embodiment 16: The method of example embodiment 13, further comprising forming the one or more vias using a single damascene process.

Example embodiment 17: The method of example embodiment 13, wherein forming the one or more vias in the adjacent upper metal layer further comprises forming the second insulating layer as a half layer and patterning the second insulating layer to form openings where one or more vias are to be formed. A conductive material layer is formed on a base layer to fill the openings in the second insulating layer. Portions of the conductive material layer are removed that extend above a top of the second insulating layer to form the one or more vias.

Example embodiment 18: The method of example embodiment 17, wherein forming the one or more vias in the adjacent upper metal layer $M_{n+1}$ further comprises: forming the base layer as a conductive seed layer deposited on a conductive barrier layer.

Example embodiment 19: The method of example embodiment 13, wherein forming the first insulating layer in the metal layer $M_n$ and forming the one or more conductive features in the first insulating layer further comprises: forming a first etch stop layer over top surfaces of the first insulating layer and the one or more conductive features.

Example embodiment 20: The method of example embodiment 19, wherein forming the one or more vias in the second insulating layer further comprises: forming a second etch stop layer over top surfaces of the second insulating layer and the one or more vias in the adjacent upper metal layer $M_{n+1}$.

Example embodiment 21: The method of example embodiment 20, wherein performing the maskless air gap etch on both the second insulating layer and the first insulating layer to form air gaps further comprises selectively removing the second etch stop layer and the second insulating layer from the adjacent upper metal layer $M_{n+1}$. The first etch stop layer and the first insulating layer are selectively removed from the metal layer $M_n$ except for portions of the first insulating layer directly beneath the one or more conductive features.

Example embodiment 22: The method of example embodiment 13, further comprising: after the maskless air gap etch, conformally depositing a third etch stop layer along a top surface of the one or more conductive features and the vias, and along sidewalls formed by the one or more conductive features and the first insulating layer beneath the one or more conductive features.

Example embodiment 23: The method of example embodiment 22, further comprising: forming a third insulating layer over the third etch stop layer to fill the metal layer $M_n$ and the adjacent upper metal layer $M_{n+1}$ and to bridge over the air gaps.

Example embodiment 24: The method of example embodiment 23, further comprising: after forming the third insulating layer, planarizing the third insulating layer to remove any protrusions over underlying via locations.

Example embodiment 25: The method of example embodiment 13, further comprising: patterning in a metal layer $M_{n+1}$ over the adjacent upper metal layer $M_{n+1}$, one or more additional conductive features, wherein at least a portion of the vias electrically connect the one or more additional conductive features with the one or more conductive features in the metal layer $M_n$.

What is claimed is:

1. An integrated circuit structure, comprising:
   one or more conductive features supported by pillars of a first insulating layer in a first metal layer;
   one or more vias in a via layer, the one or more vias over and on the first metal layer and in electrical connection with ones of the one or more conductive features;
   air gaps between adjacent ones of the one or more conductive features in the first metal layer to separate the one or more conductive features; and
   a second insulating layer over the one or more conductive features and over the one or more vias, such that the second insulating layer covers the first metal layer, the pillars of the first insulating layer, and the via layer while bridging over the air gaps, wherein tops the air gaps are substantially coplanar with tops of the one or more conductive features.

2. The integrated circuit structure of claim 1, wherein the air gaps have a pitch of less than approximately 50 nm.

3. The integrated circuit structure of claim 2, wherein the air gaps have a pitch of approximately 10 to 45 nm.

4. The integrated circuit structure of claim 1, wherein the one or more conductive features comprise a conductive material layer on a base layer.

5. The integrated circuit structure of claim 4, wherein the base layer comprise a conductive seed layer on a conductive barrier layer.

6. The integrated circuit structure of claim 1, wherein the one or more conductive features in the first metal layer supported by the pillars of the first insulating layer further include a first etch stop layer beneath the pillars of the first insulating layer.

7. The integrated circuit structure of claim 1, further comprising:
   a second etch stop layer along a top surface of the one or more conductive features and the vias, and along sidewalls formed by the one or more conductive features and the first insulating layer beneath the one or more conductive features.

8. The integrated circuit structure of claim 7, wherein the second insulating layer is over the second etch stop layer.

9. The integrated circuit structure of claim 1, further comprising:
   one or more additional conductive features in a third metal layer over the via layer, wherein at least a portion of the vias electrically connect the one or more additional conductive features with the one or more conductive features in the first metal layer.

* * * * *